United States Patent
Fujimoto et al.

(10) Patent No.: US 7,759,861 B2
(45) Date of Patent: Jul. 20, 2010

(54) ORGANIC EL DISPLAY

(75) Inventors: Akira Fujimoto, Kawasaki (JP); Koji Asakawa, Tokyo (JP); Tsutomu Nakanishi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 580 days.

(21) Appl. No.: 11/234,189

(22) Filed: Sep. 26, 2005

(65) Prior Publication Data

US 2006/0175962 A1    Aug. 10, 2006

(30) Foreign Application Priority Data

Feb. 10, 2005    (JP)    ............................... 2005-034582

(51) Int. Cl.
     *H01J 1/62*      (2006.01)
     *H01J 63/04*      (2006.01)

(52) U.S. Cl. ....................................... 313/506; 313/504

(58) Field of Classification Search .................. 313/506, 313/483

See application file for complete search history.

(56) References Cited

U.S. PATENT DOCUMENTS

| | | | | |
|---|---|---|---|---|
| 6,555,253 | B2 * | 4/2003 | Hamada et al. | 428/690 |
| 6,630,684 | B2 * | 10/2003 | Lee et al. | 257/40 |
| 6,680,799 | B1 * | 1/2004 | Parriaux et al. | 359/569 |
| 7,084,565 | B2 | 8/2006 | Cho et al. | |
| 7,589,461 | B2 * | 9/2009 | Park et al. | 313/503 |
| 2004/0247009 | A1 * | 12/2004 | Noda et al. | 372/99 |
| 2005/0127831 | A1 * | 6/2005 | Takeuchi et al. | 313/506 |
| 2006/0024011 | A1 * | 2/2006 | Enokido | 385/129 |
| 2006/0146562 | A1 * | 7/2006 | Ko et al. | 362/561 |

FOREIGN PATENT DOCUMENTS

| | | |
|---|---|---|
| DE | 101 64 016 | 7/2003 |
| DE | 102 29 231 | 1/2004 |
| DE | 103 12 219 | 10/2004 |
| FR | 2 824 228 | 10/2002 |
| JP | 2003-109749 | 4/2003 |
| JP | 2003-115377 | 4/2003 |
| JP | 2003-163075 | 6/2003 |
| JP | 2006-128011 | 5/2006 |
| KR | 10-2004-0079080 | 9/2004 |
| WO | WO 2004-086821 | 10/2004 |

OTHER PUBLICATIONS

Machine translation of KR 2004-0079080 to Cho et al. is provided.*
Yong-Jae Lee, et al., "A high-extraction-efficiency nanopatterned organic light-emitting diode", Applied Physics Letters, vol. 82, No. 21, May 26, 2003, pp. 3779-3781.

* cited by examiner

*Primary Examiner*—Toan Ton
*Assistant Examiner*—Zachary Snyder
(74) *Attorney, Agent, or Firm*—Oblon, Spivak, McClelland, Maier & Neustadt, L.L.P.

(57) ABSTRACT

In an organic EL display provided with a transparent substrate, a buffer layer provided on the transparent substrate, and an organic EL element provided on the buffer layer, the buffer layer is formed of a material having the same refractive index as the transparent electrode of the EL element, and has a two-dimensional concavo-convex structure having two pattern periods.

9 Claims, 7 Drawing Sheets

ORGANIC EL DISPLAY

CROSS-REFERENCE TO RELATED APPLICATIONS

This application is based upon and claims the benefit of priority from prior Japanese Patent Application No. 2005-034582, filed Feb. 10, 2005, the entire contents of which are incorporated herein by reference.

BACKGROUND OF THE INVENTION

1. Field of the Invention

The present invention relates to a full-color organic EL display, and more particularly, to an organic EL display improved in a light extraction portion.

2. Description of the Related Art

Organic EL displays generally comprise a glass substrate, a transparent electrode (high-refractive-index section) as an anode, a hole injection layer (hole transport layer), an emission layer formed of an organic film, and a cathode. The transparent electrode has a refractive index of about 2, which is greater than the refractive index, 1.5 to 1.7, of the glass substrate or the organic film (emission layer). Accordingly, the transparent electrode inevitably serves as a waveguide for guiding light therein, which causes about 50% light loss in the electrode. As a result, the light extraction efficiency of the organic EL displays is as low as about 18% at present.

To extract, to the outside, the light propagating through the transparent electrode, there is a technique for providing, on a transparent electrode of indium tin oxide (ITO), a diffraction grating made of a material having substantially the same refractive index as ITO, and extracting the light propagating through the electrode, using the grating. This technique is disclosed in Applied Physics Letters, 3779, vol. 82, 2003.

However, the diffraction grating diffracts light of particular wavelengths determined from the period size of the grating, namely, does not diffract all visible light (with wavelengths of 400 to 700 nm). Therefore, the method for providing a single diffraction grating on the front surface of a display is not necessarily effective.

To overcome this problem, there is a method for providing plurality of diffraction gratings respectively corresponding to the wavelengths of R, G and B pixels (see Jpn. Pat. Appln. KOKAI Publication No. 2003-163075). In this method, however, several types of diffraction gratings respectively corresponding to pixels must be prepared, which makes the manufacturing process very complex and hence the resultant products very expensive. It is difficult to put the method into practical use.

Furthermore, in general organic EL displays of a low-molecular-weight type, R pixels have a lower brightness than G and B pixels. To balance the brightness of the R, G and B pixels, much power must be supplied to the R pixels. This increases the power consumption of the displays, and reduces their lifetime.

As described above, in full-color organic EL displays, to enhance the light extraction efficiency, it is necessary to prepare diffraction gratings of sizes (pitches) corresponding to R, G and B pixels. This inevitably makes the manufacturing process very complex and the resultant products very expensive.

BRIEF SUMMARY OF THE INVENTION

In accordance with an aspect of the invention, there is provided an organic EL display comprising:

a transparent substrate;

an organic EL element provided on the transparent substrate and including a transparent electrode on a side of the transparent substrate; and a two-dimensional concavo-convex structure provided on a surface of the transparent substrate on the side of the transparent electrode, and having two kinds of pattern periods.

In accordance with another aspect of the invention, there is provided an organic EL display comprising:

a transparent substrate;

a buffer layer provided on the transparent substrate and including a two-dimensional concavo-convex structure having two kinds of pattern periods on a side of the transparent substrate; and an organic EL element provided on the buffer layer and including on a side of the buffer layer a transparent electrode having a refractive index equal to that of the buffer layer.

In accordance with yet another aspect of the invention, there is provided an organic EL display comprising:

a transparent substrate having a major surface formed in concavo-convex shape to form a two-dimensional concavo-convex structure having two kinds of pattern periods;

a buffer layer deposited on the major surface of the transparent substrate, and including a concavo-convex surface having a reversed concavo-convex pattern of the concavo-convex shape of the major surface to form a two-dimensional concavo-convex structure having two kinds of pattern periods and a flat surface opposite to the concavo-convex surface; and an organic EL element provided on the buffer layer and including on a side of the buffer layer a transparent electrode having a refractive index equal to that of the buffer layer.

DETAILED DESCRIPTION OF THE INVENTION

An embodiment of the invention will be described in detail with reference to the accompanying drawings.

Figure 1:
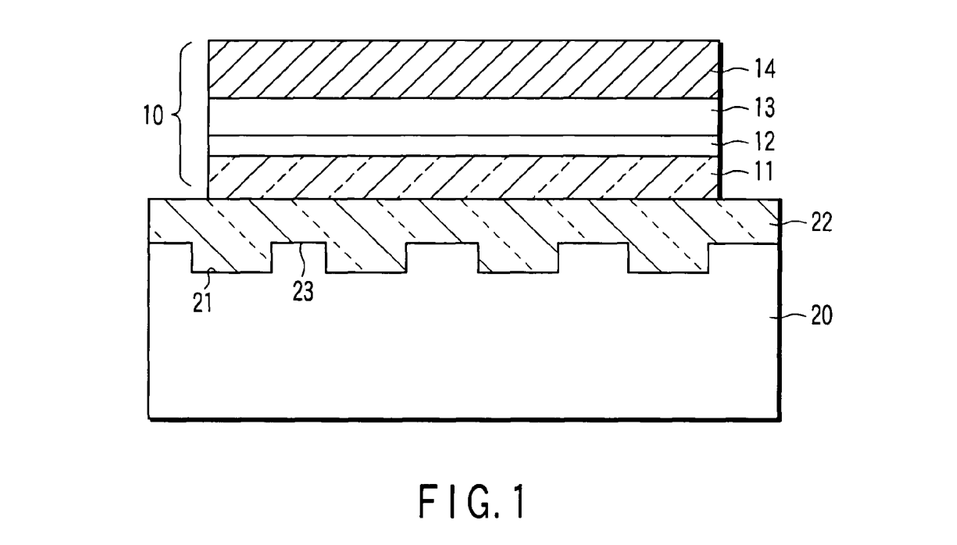
FIG. 1 is a sectional view schematically illustrating the structure of an organic EL display according to an embodiment of the invention.

FIG. 1 is a sectional view schematically illustrating the structure of an organic EL display according to the embodiment of the invention.

In FIG. 1, reference numeral 10 denotes an organic EL element. The organic EL element 10 comprises a transparent electrode (anode) 11, a hole injection layer (hole transport layer) 12, an organic film (emission layer) 13, and a cathode 14, which are stacked in this order. Further, reference numeral 20 denotes a transparent substrate of glass or plastic. A concavo-convex structure 21 is formed as the uneven (concavo-convex) upper surface of the substrate 20.

A buffer layer (high-refractive index layer) 22 formed of a material having the same refractive index as the transparent electrode 11 is provided on the transparent substrate 20 to fill the concavo-convex structure 21. As a result, the high-refractive index layer 22 has a concavo-convex structure 23. The organic EL element 10 is provided on the high-refractive index layer 22, with the transparent electrode 11 positioned at the lowest position. Instead of the high-refractive index layer 22, the transparent electrode 11 may have the concavo-convex structure 23.

Further, the organic EL element 10 may incorporate an electron injection layer (electron transport layer) as well as the hole injection layer (hole transport layer) 12. That is, the organic EL element 10 can have the following typical layer structures:

1) Transparent-electrode(anode)/emission-layer/electrode (cathode)

2) Transparent-electrode(anode)/emission-layer/electron-injection-layer/electrode (cathode)

3) Transparent-electrode(anode)/hole-injection-layer/emission-layer/electron-injection-layer/electrode (cathode), or 4) Transparent-electrode(anode)/hole-injection-layer/emission-layer/electrode (cathode)

The transparent electrode 11 as an anode may be formed of a conductive material, such as indium tin oxide (ITO), which has a large work function, and generally has a thickness of about 100 to 300 nm.

The hole injection layer 12 is formed on the transparent electrode 12 by, for example, vacuum evaporation, and then an electron injection layer is formed thereon when necessary. The electron injection layer and hole injection layer are provided to serve as layers having a charge injection property, charge transport property or charge barrier property. These layers may be formed of an organic or non-organic material, and may have a thickness of 10 to 300 nm.

In the emission layer 13, electrons and holes are recombined to thereby emit light. The cathode 14 may be formed of a metal having a small work function, such as aluminum, magnesium, indium, silver, or an alloy thereof, and may have a thickness of 10 to 500 nm.

The principle of the embodiment will now be described in detail.

Figure 2:
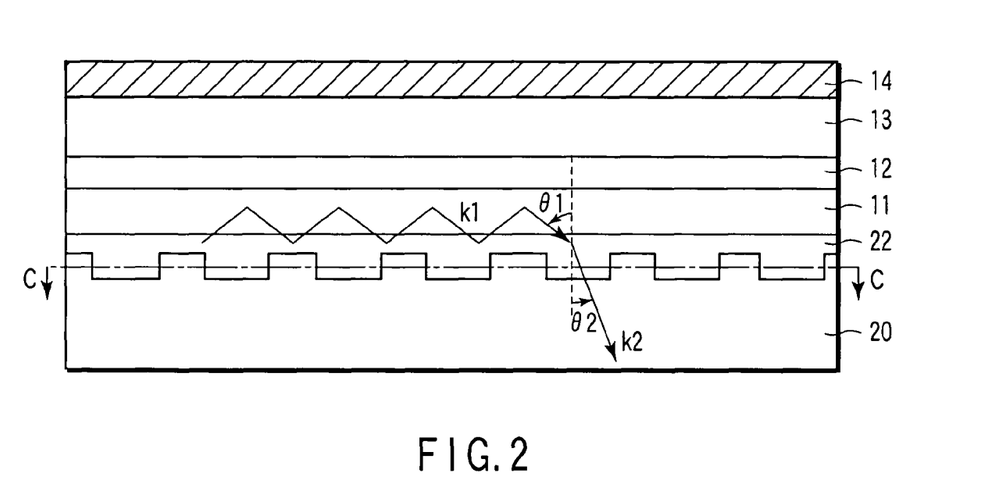
FIG. 2 is a sectional view useful in explaining light extraction by a diffraction grating.

FIG. 2 is a sectional view useful in explaining light extraction by a diffraction grating. In FIG. 2, $k_1$ is the wave vector, in the direction of propagation, of light guided in a high-refractive index section when no diffraction grating is provided. Further, $k_2$ is the wave vector of light when the light is extracted from the high-refractive index section. Assuming that Λ represents the pitch of the diffraction grating, light is emitted from the high-refractive-index section if the following condition is satisfied.

$$k_1 \sin\theta_1 + m(2\pi/\Lambda) = k_2 \sin\theta_2 \quad (1)$$

where $k_1 = n_1 \times 2\pi/\lambda$, $k_2 = n_2 \times 2\pi/\lambda$, $n_1$ is the refractive index of the high-refractive-index section, $n_2$ is the refractive index of the emission section, $\theta_1$ is the incident angle at the high-refractive-index section, $\theta_2$ is the light-outgoing angle at the emission section, and λ is the wavelength of emitted light. Further, m is the order of diffraction and an integer. As can be understood from the above equation (1), when light is guided in a certain mode in the high-refractive-index section, diffracted light having a wavelength corresponding to the pitch of the grating is generated. In other words, the light guided in the high-refractive-index section cannot be sufficiently extracted, depending upon the wavelength of the light. Namely, a single diffraction grating does not contribute to extraction of light having a plurality of wavelengths.

Figure 3:
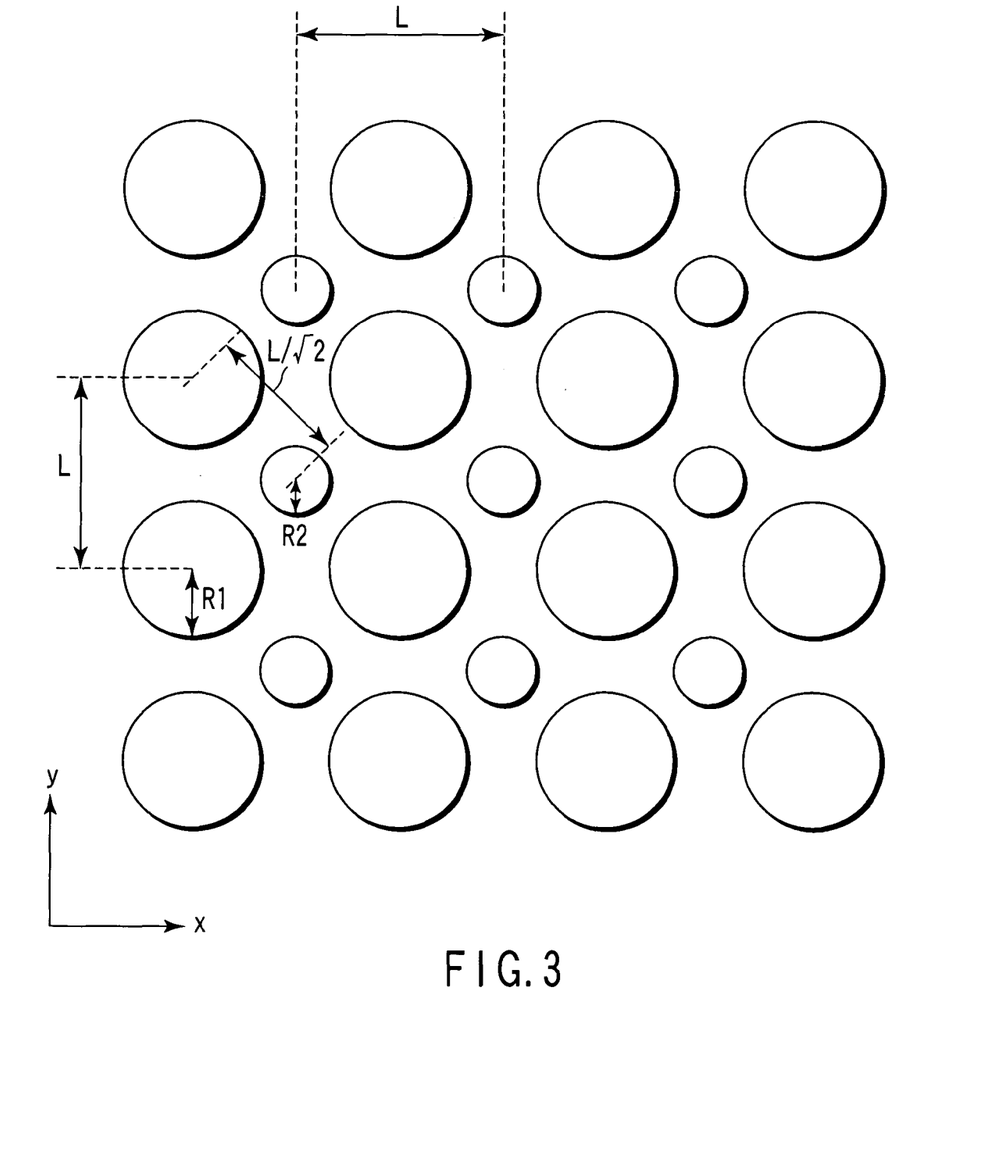
FIG. 3 is a plan view illustrating concavo-convex structure examples of two sizes.

In light of this, such a concavo-convex structure having two types of square pattern components as shown in FIG. 3 is employed. FIG. 3 shows a schematical view of cross section C-C of FIG. 2. Specifically, the concavo-convex structure of FIG. 3 has a pattern including large circles (scattering portions) arranged with a pitch L in the X- and Y-directions, and small circles (scattering portions) arranged with the same pitch in the X- and Y-directions. However, the large and small circles are deviated from each other by a pitch L/2 in the X- and Y-directions. In the case of the concavo-convex structure 21 shown in FIG. 1, which is formed of depression and projections, the scattering portions correspond to the depressions or projections.

A description will then be given of the diffraction efficiency of the concavo-convex structure with respect to wavelength.

The shorter the wavelength, the more easily light scatters. The scattering efficiency of light is inversely proportional to the wavelength of the light to the fourth power. Accordingly, blue light scatters several times easily compared to red light. Further, the scattering efficiency is proportional to the square of the area of a scattering portion. Therefore, the scattering efficiency of light of each wavelength can be adjusted by providing concavo-convex components (scattering portions) with a pitch corresponding to each wavelength, and changing the size of the scattering portions.

For instance, such a concavo-convex structure formed of two types of square pattern components as shown in FIG. 3 is prepared. In this case, the first-type square pattern components are each formed of large circles of a radius $R_1$, and the second-type square pattern components are each formed of small circles of a radius $R_2$. The distance between adjacent large circles is L, and that between adjacent small circles is also L. The distance L serves as a pattern period. On the other hand, the distance between a large circle and a small circle adjacent thereto is $L/\sqrt{2}$. The distance $L/\sqrt{2}$ serves as another pattern period. Further, the distance L corresponds to the wavelength of red light, and the distance $L/\sqrt{2}$ corresponds to the wavelength of blue light.

A description will now be given of the scattering efficiency of light of each wavelength. The scattering portions corresponding to the distance L are large circles or small circles. The interference of light between large circles or between small circles corresponds to the square of the radius, i.e., corresponds to $R_1^2$ or $R_2^2$. Since the two types of square grating components are identical in pitch, light is diffracted by them at the same angle. In contrast, the scattering portions corresponding to the distance L/2 are large and small circles, therefore the interference of light between them corresponds to $R_1 \times R_2$.

From the above, the diffraction efficiency of red light is given by $$I(red) \propto L^{-4} \times (R_1^2 + R_2^2) \quad (2)$$

Similarly, the diffraction efficiency of blue light is given by $$I(blue) \propto (L/\sqrt{2})^{-4} \times (R_1 \times R_2) \times 2 \quad (3)$$

If the pattern is designed to satisfy the above conditions, the acquisition intensities of red light and blue light can be adjusted individually.

The following Table 1 shows the intensities I of red light and blue light acquired when $R_1$ and $R_2$ are varied, with L set to 650 nm that is determined from equations (2) and (3).

TABLE 1

| L (nm) | L/√2(nm) | R1 (nm) | R2 (nm) | I (Red) | I (Blue) | I (Red)/I (Blue) |
|---|---|---|---|---|---|---|
| 650 | 459.6194078 | 150 | 50  | 1.4E−07  | 3.36E−07 | 0.416666667 |
| 650 | 459.6194078 | 150 | 100 | 1.82E−07 | 6.72E−07 | 0.270833333 |
| 650 | 459.6194078 | 200 | 50  | 2.38E−07 | 4.48E−07 | 0.53125 |
| 650 | 459.6194078 | 200 | 100 | 2.8E−07  | 8.96E−07 | 0.3125 |
| 650 | 459.6194078 | 200 | 150 | 3.5E−07  | 1.34E−06 | 0.260416667 |
| 650 | 459.6194078 | 250 | 50  | 3.64E−07 | 5.6E−07  | 0.65 |
| 650 | 459.6194078 | 250 | 100 | 4.06E−07 | 1.12E−06 | 0.3625 |
| 650 | 459.6194078 | 250 | 150 | 4.76E−07 | 1.68E−06 | 0.283333333 |
| 650 | 459.6194078 | 250 | 200 | 5.74E−07 | 2.24E−06 | 0.25625 |
| 650 | 459.6194078 | 300 | 50  | 5.18E−07 | 6.72E−07 | 0.770833333 |
| 650 | 459.6194078 | 300 | 100 | 5.6E−07  | 1.34E−06 | 0.416666667 |
| 650 | 459.6194078 | 300 | 150 | 6.3E−07  | 2.02E−06 | 0.3125 |

It can be understood from Table 1 that when the number of large scattering portions existing per unit area is equal to that of small ones, the scattering efficiency of blue light is higher than that of red light. To balance the brightness of blue and red light, it is desirable that the ratio of the number of large scattering portions and that of small scattering portions per unit area should be set to from 5:1 to 1:1.

Figure 4A:
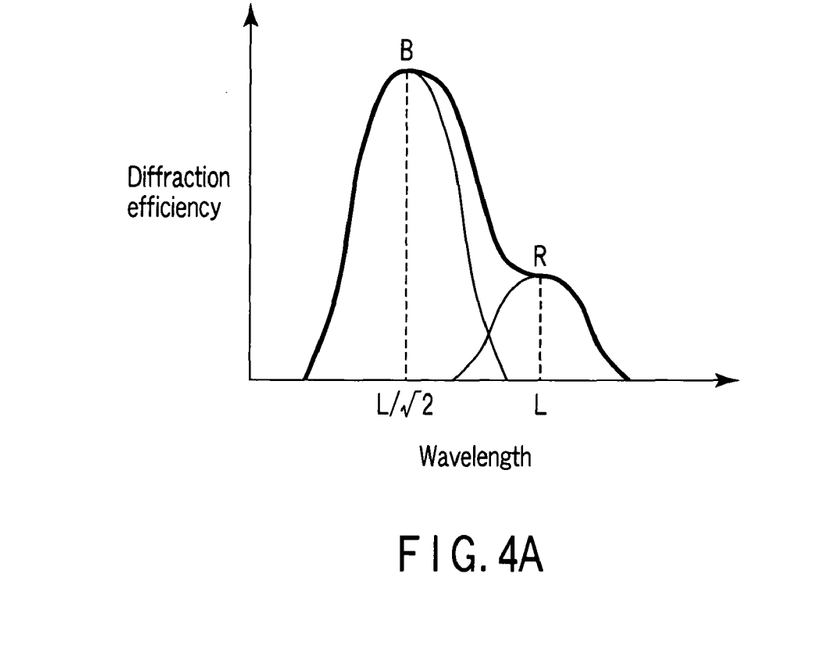
FIG. 4A is a graph illustrating the relationship between the wavelength and the diffraction efficiency.
Figure 4B:
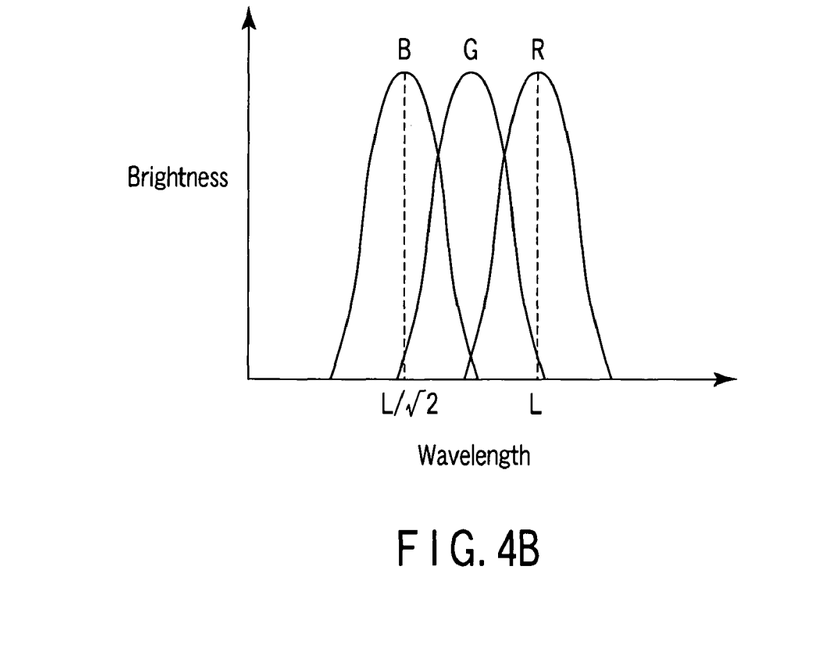
FIG. 4B is a graph illustrating the relationship between the wavelength and the brightness.

For example, the square pattern shown in FIG. 3 will be described in more detail. Assume here that L=650 nm, $R_1$=250 nm, $R_2$=100 nm, and the ratio of the number of large scattering portions and that of small scattering portion per unit area should be set to 1:1.In this case, I(red)/I(blue)= 0.362,which means that the diffraction efficiency of blue light is substantially three times that of red light. From this, the relationship between the wavelength and the diffraction efficiency is as shown in FIG. 4A. As is evident from FIG. 4A, the diffraction efficiency is increased when the wavelengths of red and blue light are combined. Further, it is further increased by combining the wavelengths of red, blue and green light. Thus, all R, G and B light can be increased in brightness by the concavo-convex structure including two types of pattern components.

Where R, G and B light are equal in brightness without grating, their brightness are enhanced using the above concavo-convex structure. However, the ratio of the brightness levels is R:G:B=0.363:0.363:1. To balance the brightness, it is sufficient if the ratio of the number of large scattering portions and that of small scattering portions per unit area is set to about 3:1. At this time, the diffraction efficiency of R light is increased, whereby the brightness of R, G and B light are made to be substantially equal as shown in FIG. 4B.

In the above, it is described that the concavo-convex structure shown in FIG. 3 comprises two types of square pattern components. The first-type square pattern components are each formed of four large circles, and the second-type square pattern components are each formed of four small circles. From another point of view, it can be described that the concavo-convex structure of FIG. 3 is constructed in the following manner. That is, large and small circles as scattering portions are alternately arranged with a certain pattern pitch (L/2) in the X- and Y-directions. Groups of large circles each include four large circles and form a first square pattern component, while groups of four small circles each include four small circles and form a second square pattern component. Namely, in the concavo-convex structure of FIG. 3, scattering portions of two sizes are arranged at the four pattern points of each square pattern component of a certain pattern pitch (L/√2), such that scattering portions of different sizes are arranged at adjacent pattern points.

Figure 5:
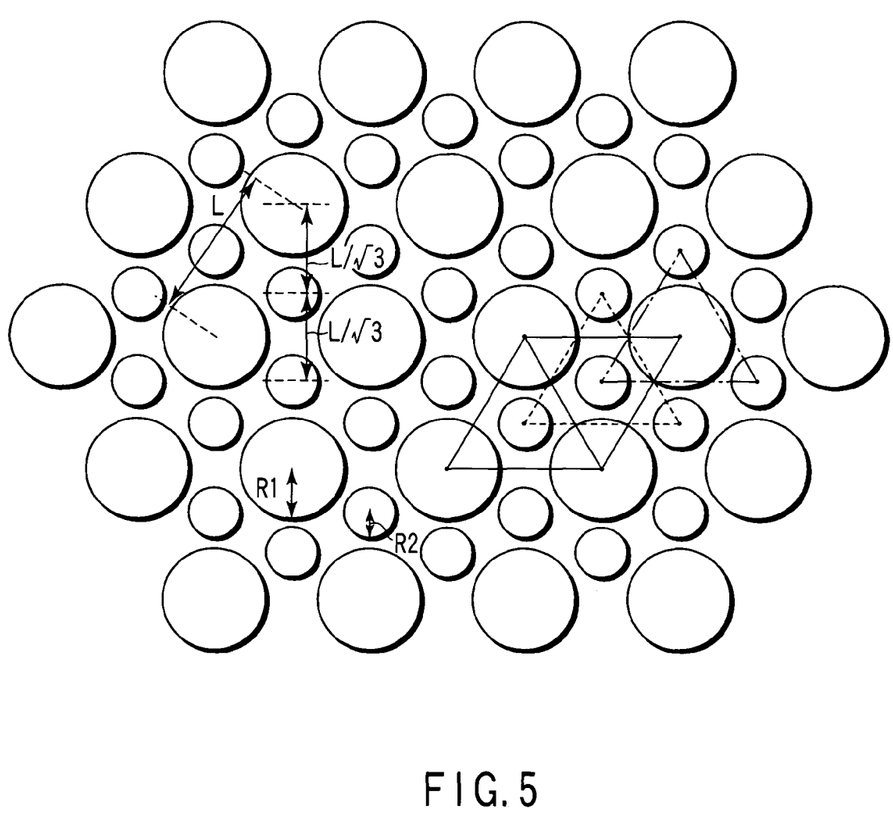
FIG. 5 is a plan view illustrating other concavo-convex structure examples of two sizes.

Referring now to FIG. 5, a brief description will be given of the diffraction efficiency of a triangular concavo-convex structure as another example having two types of triangular pattern components. In the case of FIG. 5, the first-type triangular pattern components are each formed of three large circles ofa radius $R_1$, and the second-type triangular pattern components are each formed of three small circles of a radius $R_2$. The distance between adjacent large circles is L, that between adjacent small circles is L/√3,and that between adjacent large and small circles is L/√3.

In this case, the diffraction efficiency of red light is given by $$I(red) \propto L^{-4} \times 12 R_1^2 \qquad (4)$$

Similarly, the diffraction efficiency of red light is given by $$I(blue) \propto (L/\sqrt{3})^{-4} \times (3 R_2^2 + 9 R_1 \times R_2) \qquad (5)$$

Also in this case, even if the brightness of R light material is low, the brightness of R, G and B light can be balanced by appropriately setting L, $R_1$ and $R_2$ to appropriately set the diffraction efficiencies of red and blue light. The invention is not limited to the above-described concavo-convex structure including square pattern components or triangular pattern components. Other concavo-convex structures of a two-dimensional structure, which include, for example, honeycomb-shaped pattern components, may be employed.

As described above, in the embodiment, the concavo-convex structure 23 having two pattern periods (e.g. L and L/√2, or L and L/√3), which appropriately corresponds to R, G and B light, is provided at the high-refractive-index layer 22 formed between the organic EL element 10 and the transparent electrode 20. In this case, it is not necessary to provide respective concavo-convex structure for R, G and B light, and it is sufficient if a single concavo-convex structure is provided on the entire display surface.

In other words, a concavo-convex structure that has pattern components of sizes (pattern intervals) corresponding to R, G and B light can be manufactured at a time, which can simplify the manufacturing process and reduce the manufacturing cost, resulting in realization of a cost-effective high-brightness organic EL display using a concavo-convex structure. Further, in the embodiment, the diffraction efficiency of R light can be enhanced by increasing the ratio of the number of concavo-convex structure components corresponding to R light to those of B and G light. As a result, the brightness of R, G and B light can be balanced, which suppresses the power consumption of the display and hence increases the lifetime of the display.

The uneven surface of the high-refractive-index layer in the organic EL display of FIG. 1 is formed, for example, in the following manner.

Figure 6A:
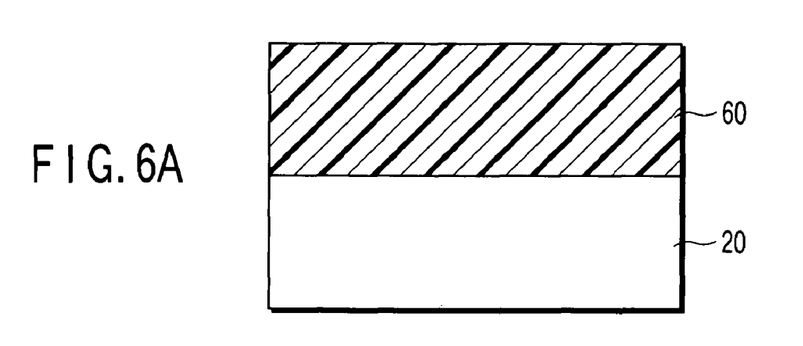
FIGS. 6A to 6D are sectional views illustrating a process for manufacturing an organic EL display as example 1.

Firstly, as shown in FIG. 6A, an electron-beam resist layer 60 is formed about 300 nm thick on a glass substrate 20.

Figure 6B:
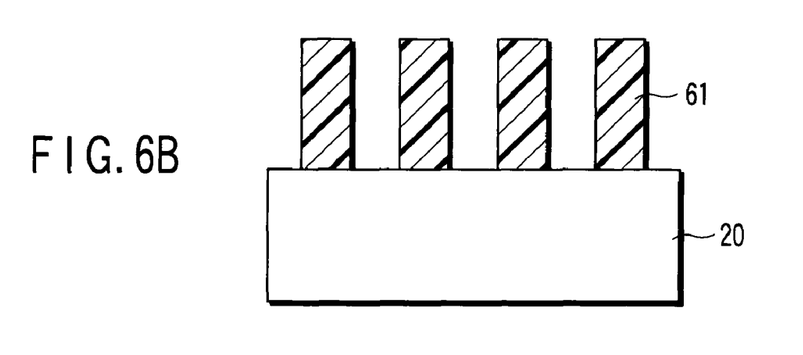

Subsequently, the resist layer 60 is drawn by an electron beam using a mask having two types of concavo-convex structure components as shown in FIG. 3. After that, the resultant structure is developed. As a result, the resist pattern 61 as shown in FIG. 6B is acquired.

Figure 6C:
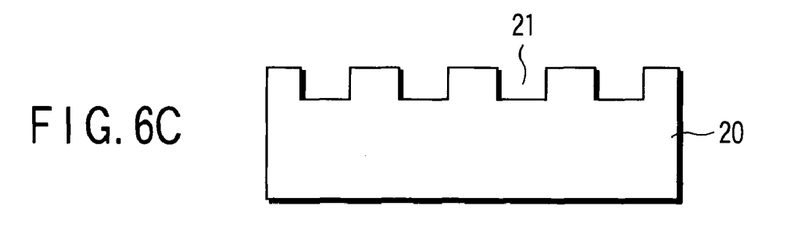

Thereafter, using the developed resist pattern 61 as a mask, the glass substrate is dry etched by reactive ion etching (RIE) using CF4. After etching the structure by about 100 nm, the remaining resist pattern 61 is removed by ashing, thereby forming holes of two sizes concavo-convex structure 21) in the surface of the glass substrate 20, as shown in FIG. 6C.

Figure 6D:
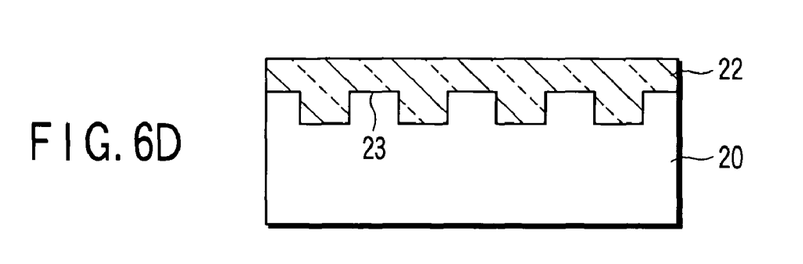

After that, as shown in FIG. 6D, an SiN film (high-refractive-index layer) 22 is deposited about 500 nm thick by plasma CVD (chemical vapor etching on the glass substrate 20 with the concavo-convex structure 21. As a result, a concavo-convex structure 23 is formed as the surface of the SiN film 22.

After that, an ITO film 11 is deposited on the SiN film 22 by sputtering, thereby forming an anode. Further, a hole injection layer 12, an emission layer 13 and a cathode 14 are formed thereon by a evaporation method. Thus, an organic EL display having the two types of concavo-convex structure components as shown in FIGS. 1 and 3 is acquired.

The hole injection layer 12 and emission layer 13 may be formed by spin coating, casting, etc. In this case, an organic or non-organic material is solved by a volatile solvent to thereby prepare a raw solution. A transparent substrate with an anode formed thereon is coated with the raw solution, while it is rotated as occasion demands. After that, the solvent is evaporated to acquire a thin film. The electron injection layer, which is not employed in the case of FIG. 1, is formed in the same manner as this.

The invention will be described in more detail, using examples. In the examples described below, to simply estimate the effect of enhancing the brightness of R, G and B light by the concavo-convex structure including two types of pattern components, R, G and B organic EL elements of 1 cm$^2$ were formed on a substrate provided with the concavo-convex structure, and the resultant structure was compared with a structure with no concavo-convex structure.

EXAMPLE 1

An electron-beam resist layer 60 (EEP-301 produced by Fuji Film Corporation) was formed 300 nm thick on the glass substrate 20 (FIG. 6A). Subsequently, the resist layer 60 was processed by an electron-beam exposure apparatus equipped with a pattern generator and utilizing an acceleration voltage of 50 kV, thereby forming the pattern shown in FIG. 3 (FIG. 6B). In this case, the pattern was designed such that L=650 nm, $R_1$=250 nm, $R_2$=100 nm and the ratio of the number of large scattering portions and that of small scattering portions per unit area was 1:1. After that, using the resultant structure as a mask, the glass substrate 20 was dry etched by RIE for two minutes at a pressure of 1.33 Pa (10 mTorr), a power of 100 W, and a $CF_4$ flow of 30 sccm. After RIE, the remaining resist was removed by $O_2$ ashing (FIG. 6C). The etching depth was 100 nm.

Subsequently, an SiN film (n=1.9) 22 was formed 500 nm thick on the glass substrate 20 with the uneven pattern by plasma CVD (FIG. 6D). By this process, the surface of the SiN film was made flat. An ITO film 11 serving as an anode was formed 150 nm thick on the SiN film 22 by sputtering.

Thereafter, R, G and B organic EL elements were prepared in the following manner:

(R)

On the ITO film 11, N,N'-diphenyl-N, N'-bis(3-methlfenyl)1-1'biphenyl-4, 4'diamine (hereinafter referred to as "TPD") was deposited 50 nm thick by evaporation. A tris (8-hydroxyquinoline) aluminum (hereinafter referred to "Alq3") layer doped with 2% DCM 2 was deposited 100 nm thick on the resultant structure by evaporation. Lastly, an Mg:Ag (5%) electrode 14 was deposited 150 nm thick on the resultant structure by evaporation, thereby forming a red element. The peak wavelength of the light emitted from the red element was 650 nm.

(G)

TPD serving as the hole injection layer 12 was deposited 50 nm thick on the ITO film 11 by evaporation. On the layer 12, Alq3 serving as the emission layer 13 was deposited 100 nm thick by evaporation. Lastly, an Mg:Ag (5%) electrode 14 was deposited 150 nm thick on the resultant structure by evaporation, thereby forming a green element. The peak wavelength of the light emitted from the green element was 530 nm.

(B)

Triphenylamine tetramer (TPTE) serving as the hole injection layer 12 was deposited 50 nm thick on the ITO film 11 by evaporation. On the layer 12, a pyrene adamantan derivative serving as the emission layer 13 was deposited 100 nm thick by evaporation. Lastly, LiF(1 nm)/Al(150 nm) serving as an electrode 14 was deposited on the resultant structure by evaporation, thereby forming a blue element. The peak wavelength of the light emitted from the blue element was 450 nm.

It was confirmed that the brightness of the R, G and B elements with the concavo-convex structure increased 1.3 times, 1.5 times, and 1.7 times compared with those without concavo-convex structure, respectively.

EXAMPLE 2

In the same manner as in example 1, an electron-beam resist layer 60 was formed on the glass substrate 20 and the pattern shown in FIG. 3 was formed. Using this pattern as a mask, the glass substrate was dry etched by RIE for two minutes at a pressure of 1.33 Pa (10 mTorr), a power of 100 W, and a $CF_4$ flow of 30 sccm. After RIE, the remaining resist pattern 61 was removed by $O_2$ ashing. As a result, holes of two sizes (concavo-convex structure 21) were formed in the surface of the glass substrate 20. The etching depth was 100 nm.

Figure 7A:
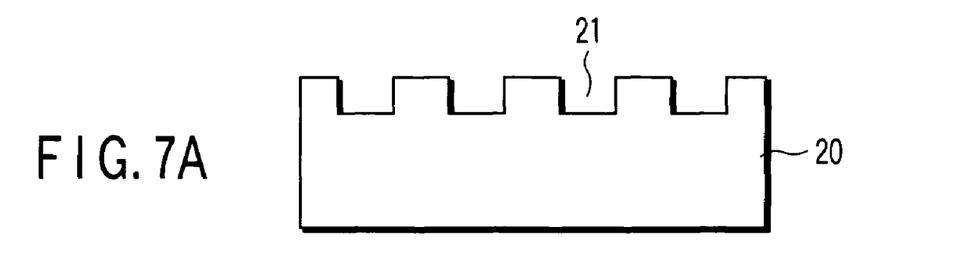
FIGS. 7A to 7C are sectional views illustrating a process for manufacturing an organic EL display as example 2.
Figure 7B:
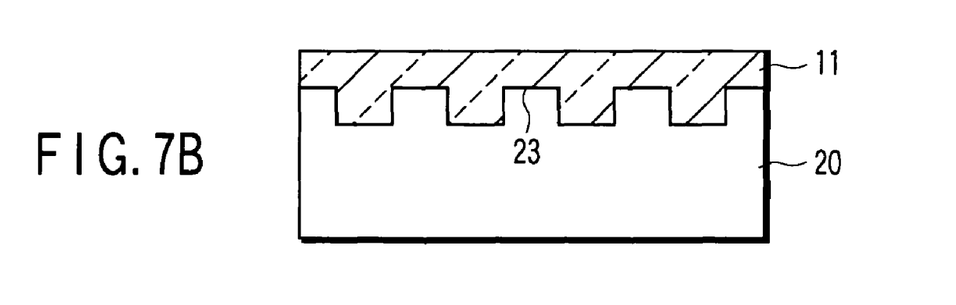

Subsequently, as shown in FIG. 7B, an ITO film (n=1.9) 11 serving as a transparent electrode was formed 300 nm thick by sputtering on the glass substrate 20 with the uneven pattern. By this process, a concavo-convex structure 23 was formed as the lower surface of the ITO film 11, and the surface of the ITO film 11 was made flat.

Figure 7C:
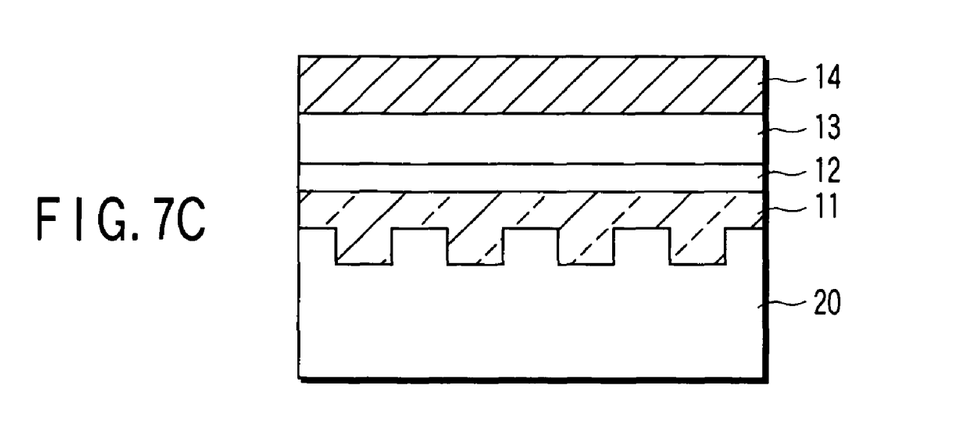

After that, as shown in FIG. 7C, the organic layer 13 and cathode 14 of each of R, G and B organic EL elements were formed by the same processes as in example 1.

It was confirmed that the brightness of the R, G and B elements with a concavo-convex structure increased 1.25 times, 1.4 times, and 1.65 times compared with those without concavo-convex structure, respectively.

EXAMPLE 3

Figure 8A:
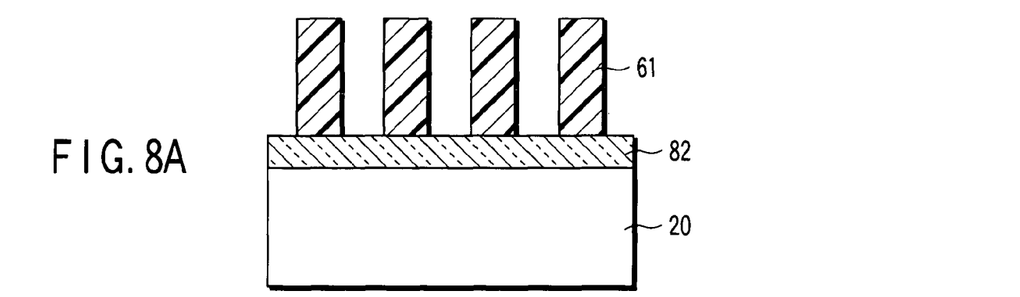
FIGS. 8A to 8E are sectional views illustrating a process for manufacturing an organic EL display as example 3.

As shown in FIG. 8A, an SiN (n=1.9) film 82 was formed 200 nm thick on the glass substrate 20 by plasma CVD. On the film 82, an electron-beam resist layer 60 was formed on the glass substrate 20 and the pattern was drawn by electron-beam, and the resist was developed. Thereby a resist pattern 61 having the pattern shown in FIG. 3, as in example 1 was formed.

Figure 8B:
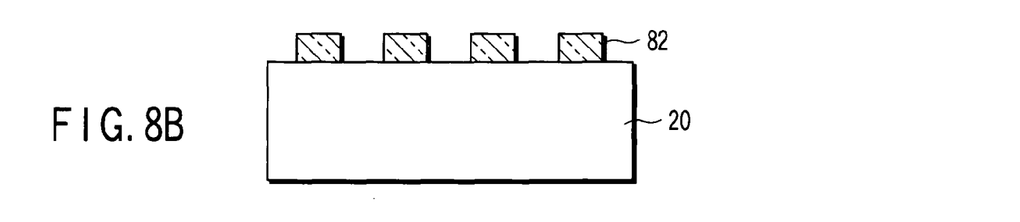

Using the resist pattern 61 as a mask, the glass substrate was dry etched by RIE for ten minutes at a pressure of 1.33 Pa (10 mTorr), a power of 100 W, and a $CF_4$ flow of 30 sccm. After RIE, the remaining resist pattern 61 was removed by $O_2$ ashing. As a result, a diffraction pattern of the SiN film 82 having a thickness of 200 nm was formed as shown in FIG. 8B.

Figure 8C:
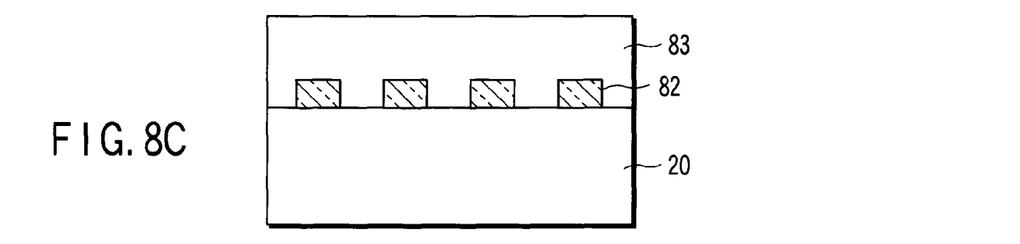

Subsequently, as shown in FIG. 8C, spin on glass (SOG) as organic silica while it is rotated at 2000 rpm was coated on the resultant structure, and then was baked at 150° C. Thereby an SOG film 83 with a thickness of 300 nm was formed. By this process, the surface of the film 83 was made flat.

Figure 8D:
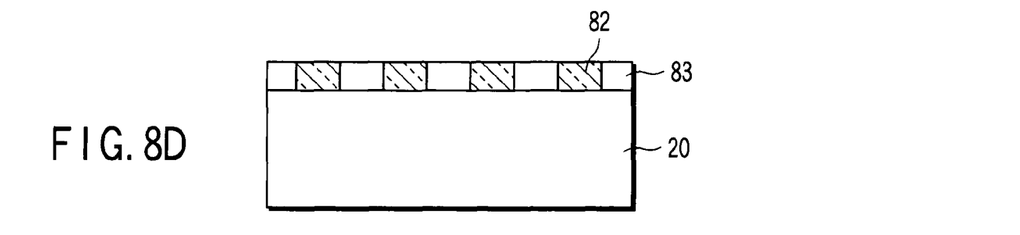

Thereafter, the SOG film 83 was dry etched by RIE for three minutes at a pressure of 1.33 Pa (10 mTorr), a power of 100 W, and a $CF_4$ flow of 30 sccm, thereby exposing the surface of the SiN film 82. As a result, a concavo-convex structure pattern of the SiN film 82 was formed as shown in FIG. 8D.

Figure 8E:
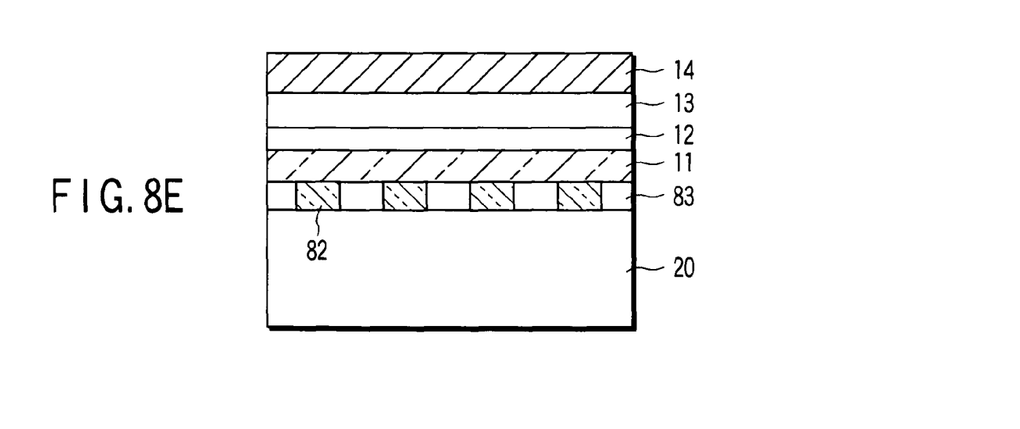

After that, the same processes as in example 1 were performed to form the anode 11, hole injection layer 12, organic (emission) layer 13 and cathode 14 of each of R, G and B organic EL elements. As a result, the organic EL display as shown in FIG. 8E was acquired.

It was confirmed that the brightness of the R, G and B elements with the concavo-convex structure increased 1.5 times, 1.7 times, and 1.9 times compared with those without the concavo-convex structure, respectively.

EXAMPLE 4

An electron-beam resist layer 60 (EEP-301 produced by Fuji Film Corporation) was formed 300 nm thick on the glass substrate 20 (FIG. 6A). Subsequently, the resist layer 60 was processed by an electron-beam exposure apparatus equipped with a pattern generator and utilizing an acceleration voltage of 50 kV, thereby forming the triangular component pattern shown in FIG. 5 (FIG. 6B). Using this pattern as a mask, the glass substrate was dry etched by RIE for two minutes at a pressure of 1.33 Pa (10 mTorr), a power of 100 W, and a $CF_4$ flow of 30 sccm. After RIE, the remaining resist was removed by $O_2$ ashing (FIG. 6C). The etching depth was 100 nm.

Subsequently, an SiN film (n=1.9) 22 was formed 500 nm thick on the glass substrate 20 with the uneven pattern by plasma CVD (FIG. 6D). By this process, the surface of the SiN film was made flat. An ITO film 11 was formed 150 nm thick on the SiN film 22 by sputtering.

Thereafter, the hole injection layer 12, organic (emission) layer 13 and cathode 14 of each of R, G and B organic EL elements were prepared by the same processes as in example 1.

It was confirmed that the brightness of the R, G and B elements with the concavo-convex structure increased 1.3 times, 1.35 times, and 1.7 times compared with those without concavo-convex structure, respectively.

EXAMPLE 5

A description will be given of the control of the balance of R, G and B brightness.

If no concavo-convex structure is provided for the R, G and B organic EL elements of example 1, and the same power is applied to the elements, their brightness ratio is R:G:B=0.5:1:1.

As in the case of example 1, the electron-beam resist layer 60 was formed on the glass substrate 20, and the resist pattern 61 was formed using the electron-beam exposure apparatus. The resultant concavo-convex structure pattern was similar to that shown in FIG. 3, but the ratio of the number of large scattering portions and that of small scattering portions per unit area was set to 3:1.

Using this pattern as a mask, the surface of the glass substrate 20 was dry etched by RIE for three minutes at a pressure of 1.33 Pa (10 mTorr), a power of 100 W and a $CF_4$ flow of 30 sccm. After RIE, the remaining resist pattern 61 was removed by $O_2$ ashing. The etching depth was 150 nm.

Subsequently, an SiN film (n=1.9) 22 was formed 500 nm thick on the glass substrate 20 with the uneven pattern by plasma CVD. By this process, the surface of the SiN film was made flat. An ITO film 11 was formed 150 nm thick on the SiN film 22 by sputtering. Thereafter, the hole injection layer 12, organic (emission) layer 13 and cathode 14 of each of R, G and B organic EL elements were prepared by the same processes as in example 1.

It was confirmed that when the same power was supplied to the thus-acquired R, G and B elements, the ratio of the brightness was R:G:B=1:0.95:0.95. Thus, the use of the concavo-convex structure including two types of pattern components significantly improves the balance of the brightness of the R, G and B elements.

(Modification)

The invention is not limited to the above-described embodiment. In the embodiment, the two-dimensional concavo-convex structure includes square or triangular pattern components. However, other pattern components may be employed. It is sufficient if the concavo-convex structure includes two types of pattern components of different pattern periods (pitches).

Further, the embodiment employs pattern pitches of 650 nm and 460 nm (or 375 nm). However, it is sufficient if one of the two pitches corresponds to the wavelength of red light ranging from 600 nm to 700 nm, and the other pitch corresponds to the wavelength of blue, blue-violet or violet light of 350 nm to 460 nm. In addition, the ratio of the number of scattering portions corresponding to the longer pitch and that of small scattering portions corresponding to the shorter pitch may be changed in accordance with the specifications of the device. In general, this ratio may be selected from the range of 5:1 to 1:1.

The structure of the organic EL element is not limited to that of FIG. 1, and may be modified in accordance with the specifications.

Additional advantages and modifications or differences will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL display comprising:
   a transparent substrate having a surface;
   an organic EL element provided on or above the surface of the transparent substrate and including a transparent electrode disposed on or beside the surface of the transparent substrate;
   a two-dimensional concavo-convex structure provided on the surface of the transparent substrate, having two kinds of pattern periods and first and second types of convex structures where said first type of convex structure has an area smaller than an area of said second type of convex structure, and being provided in a pattern adapted for each of R, G and B light; and a buffer layer disposed between said transparent electrode and said concavo-convex structure, wherein a refractive index of said transparent electrode is approximately the same as a refractive index of said buffer layer, wherein one of the two kinds of pattern periods corresponds to light with a wavelength of 600 nm to 700 nm, and the other of the two kinds of pattern periods corresponds to light with a wavelength of 350 nm to 460 nm, and wherein the concavo-convex structure includes a first concavo-convex structure in which convex and concave portions are arranged at pattern points of a first square pattern and a second concavo-convex structure in which convex and concave portions are arranged at pattern points of a second square pattern, an averaged X-directional interval of the first square pattern component being equal to an averaged Y-directional interval of the first square pattern component, an averaged X-directional interval of the second square pattern component and an averaged Y-directional interval thereof being substantially equal to the X-directional interval of the first square pattern component and the Y-directional interval thereof, the second square pattern component being deviated from the first square pattern component by substantially half a pattern period of the first square pattern component in an X-direction and a Y-direction.

2. The organic EL display according to claim 1, wherein the first concavo-convex structure and the second concavo-convex structure include respective scattering portions arranged in the X-direction and the Y-direction with the averaged X-directional interval and the averaged Y-directional interval, the scattering portions of the first square pattern component having a size different from a size of the scattering portions of the second square pattern component.

3. An organic EL display comprising:
a transparent substrate having a surface;
an organic EL element provided on or above the surface of the transparent substrate and including a transparent electrode disposed on or beside the surface of the transparent substrate;
a two-dimensional concavo-convex structure provided on the surface of the transparent substrate, having two kinds of pattern periods and first and second types of convex structures where said first type of convex structure has an area smaller than an area of said second type of convex structure, and being provided in a pattern adapted for each of R, G and B light; and
a buffer layer disposed between said transparent electrode and said concavo-convex structure, wherein a refractive index of said transparent electrode is approximately the same as a refractive index of said buffer layer,
wherein one of the two kinds of pattern periods corresponds to light with a wavelength of 600 nm to 700 nm, and the other of the two kinds of pattern periods corresponds to light with a wavelength of 350 nm to 460 nm, and
wherein the concavo-convex structure includes scattering portions comprising concave and convex structures of two sizes provided at pattern points arranged with regular X-directional intervals and regular Y-directional intervals, the scattering portions of the two sizes being alternately arranged at adjacent ones of the pattern points.

4. The organic EL display according to claim 3, wherein a ratio of number of first scattering portions per unit area to a ratio of number of second scattering portions per unit area is set to 5:1 to 1:1, the first scattering portions being larger than the second scattering portions.

5. An organic EL display comprising:
a transparent substrate comprising a surface;
a buffer layer provided on or above the surface of the transparent substrate and including a two-dimensional concavo-convex structure having two kinds of pattern periods on or beside the surface of the transparent substrate and first and second types of convex structures where said first type of convex structure has an area smaller than an area of said second type of convex structure and being provided in a pattern adapted for each of R, G and B light; and
an organic EL element provided on or above the buffer layer and including a transparent electrode, the transparent electrode having a refractive index substantially equal to that of the buffer layer and formed on or beside the buffer layer,
wherein one of the two kinds of pattern periods corresponds to light with a wavelength of 600 nm to 700 nm, and the other corresponds to light with a wavelength of 350 nm to 460 nm, and
wherein the concavo-convex structure includes a first concavo-convex structure in which convex and concave portions are arranged at pattern points of a first square pattern and a second concavo-convex structure in which convex and concave portions are arranged at pattern points of a second square pattern, an averaged X-directional interval of the first square pattern component being substantially equal to an averaged Y-directional interval of the first square pattern component, an averaged X-directional interval of the second square pattern component and an averaged Y-directional interval thereof being substantially equal to the X-directional interval of the first square pattern component and the Y-directional interval thereof, the second square pattern component being deviated from the first square pattern component by substantially half a pattern period of the first square pattern component in an X-direction and a Y-direction.

6. The organic EL display according to claim 5, wherein the first concavo-convex structure and the second concavo-convex structure include respective scattering portions arranged in the X-direction and the Y-direction with the averaged X-directional interval and the averaged Y-directional interval, the scattering portions of the first square pattern component having a size different from a size of the scattering portions of the second square pattern component.

7. An organic EL display comprising:
a transparent substrate comprising a surface;
a buffer layer provided on or above the surface of the transparent substrate and including a two-dimensional concavo-convex structure having two kinds of pattern periods on or beside the surface of the transparent substrate and first and second types of convex structures where said first type of convex structure has an area smaller than an area of said second type of convex structure and being provided in a pattern adapted for each of R, G and B light; and
an organic EL element provided on or above the buffer layer and including a transparent electrode, the transparent electrode having a refractive index substantially equal to that of the buffer layer and formed on or beside the buffer layer, wherein one of the two kinds of pattern periods corresponds to light with a wavelength of 600 nm to 700 nm, and the other corresponds to light with a wavelength of 350 nm to 460 nm, and wherein the concavo-convex structure includes scattering portions comprising concave and convex structures of two sizes provided at pattern points arranged with regular X-directional intervals and regular Y-directional intervals, the scattering portions of the two sizes being alternately arranged at adjacent ones of the pattern points.

8. The organic EL display according to claim 7, wherein a ratio of number of first scattering portions per unit area to number of second scattering portions per unit area is set to 5:1 to 1:1, the first scattering portions being larger than the second scattering portions.

9. An organic EL display comprising:

a transparent substrate having a surface formed in concavo-convex shape to form a two-dimensional concavo-convex structure having two kinds of pattern periods and first and second types of convex structures where said first type of convex structure has an area smaller than an area of said second type of convex structure;

a buffer layer deposited on or above the surface of the transparent substrate, and including a concavo-convex surface having a reversed concavo-convex pattern of the concavo-convex shape of the surface of the transparent substrate and a flat surface opposite to the concavo-convex surface and being provided in a pattern adapted for each of R, G and B light; and an organic EL element provided on or above the buffer layer and including a transparent electrode, the transparent electrode having a refractive index substantially equal to that of the buffer layer and formed on or beside the buffer layer, wherein the concavo-convex surface of the buffer layer includes a first concavo-convex structure in which convex and concave portions are arranged at pattern points of a first square pattern and a second concavo-convex structure in which convex and concave portions are arranged at pattern points of a second square pattern, an averaged X-directional interval of the first square pattern component being equal to an averaged Y-directional interval of the first square pattern component, an averaged X-directional interval of the second square pattern component and an averaged Y-directional interval thereof being substantially equal to the averaged X-directional interval of the first square pattern component and the averaged Y-directional interval thereof, the second square pattern component being deviated from the first square pattern component by substantially half a pattern period of the first square pattern component in an X-direction and a Y-direction.

* * * * *